US012666597B2

(12) United States Patent
Chen et al.

(10) Patent No.: US 12,666,597 B2
(45) Date of Patent: Jun. 23, 2026

(54) MEMORY DEVICES HAVING VERTICAL TRANSISTORS AND FABRICATING METHODS THEREOF

(71) Applicant: YANGTZE MEMORY TECHNOLOGIES CO., LTD., Wuhan (CN)

(72) Inventors: He Chen, Wuhan (CN); Ziqun Hua, Wuhan (CN); Yanhong Wang, Wuhan (CN); Wei Liu, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 437 days.

(21) Appl. No.: 18/198,147

(22) Filed: May 16, 2023

(65) Prior Publication Data

US 2023/0380142 A1     Nov. 23, 2023

Related U.S. Application Data

(60) Provisional application No. 63/343,840, filed on May 19, 2022, provisional application No. 63/340,150, filed on May 10, 2022.

(30) Foreign Application Priority Data

May 8, 2023    (CN) .......................... 202310524576.7

(51) Int. Cl.
*H10B 12/00*            (2023.01)

(52) U.S. Cl.
CPC ....... *H10B 12/395* (2023.02); *H10B 12/0383* (2023.02); *H10B 12/05* (2023.02); *H10B 12/053* (2023.02); *H10B 12/312* (2023.02); *H10B 12/33* (2023.02); *H10B 12/34* (2023.02); *H10B 12/482* (2023.02); *H10B 12/488* (2023.02)

(58) Field of Classification Search
CPC ........ H10B 12/33; H10B 12/36; H10B 12/37; H10B 12/312; H10B 12/373; H10B 12/395; H10B 12/0383; H10D 30/025
See application file for complete search history.

(56) References Cited

U.S. PATENT DOCUMENTS

| | | | |
|---|---|---|---|
| 10,181,472 B1 * | 1/2019 | Huang ................... | H10D 30/63 |
| 2018/0069052 A1 * | 3/2018 | Sekar ..................... | H10B 41/41 |
| 2022/0130834 A1 * | 4/2022 | Lee ..................... | G11C 11/4023 |

* cited by examiner

*Primary Examiner* — Tucker J Wright
(74) *Attorney, Agent, or Firm* — BAYES PLLC

(57)            ABSTRACT

A three-dimensional (3D) memory device and a fabricating method thereof are disclosed. The 3D memory device can comprise an array of memory cells. Each memory cell can comprise a capacitor and a vertical transistor. The vertical transistor can comprise a semiconductor body extending in a vertical direction and in contact with the capacitor, and a three-sided gate structure surrounding the semiconductor body from three lateral directions. The 3D memory device can further comprise a memory controller configured to control the array of memory cells.

19 Claims, 13 Drawing Sheets

200B

<u>200A</u>
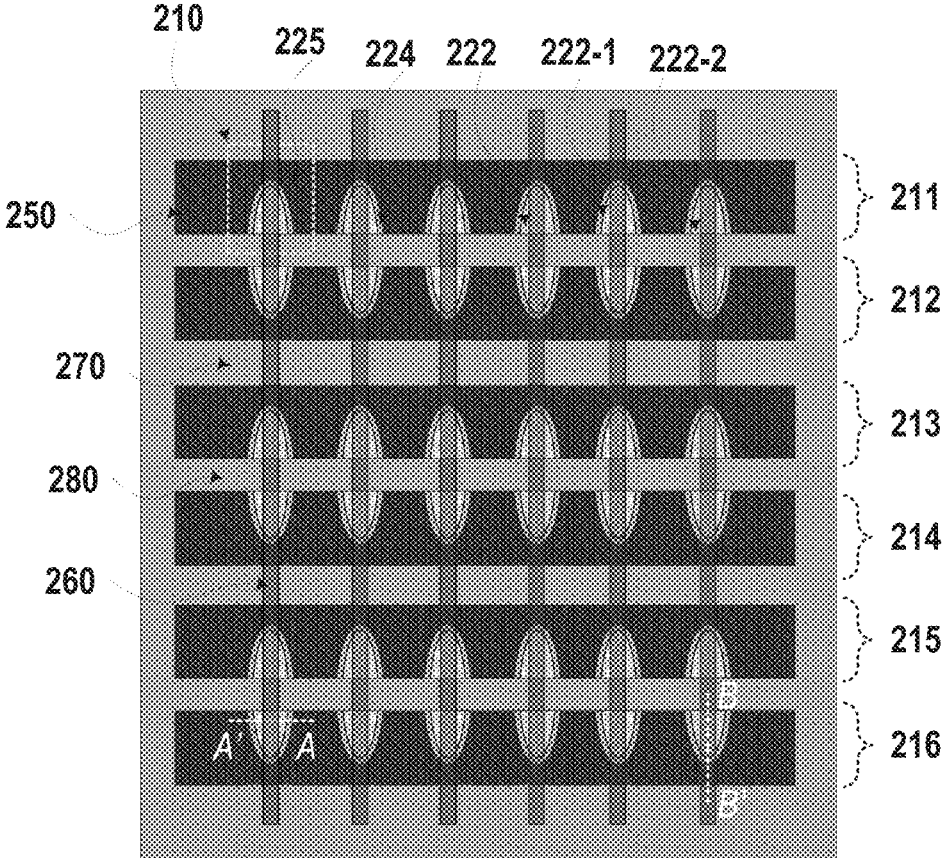
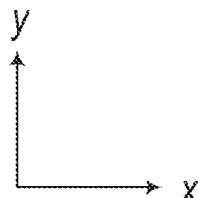
FIG. 2A

<u>200B</u>

300A

<u>300B</u>

<u>400</u>

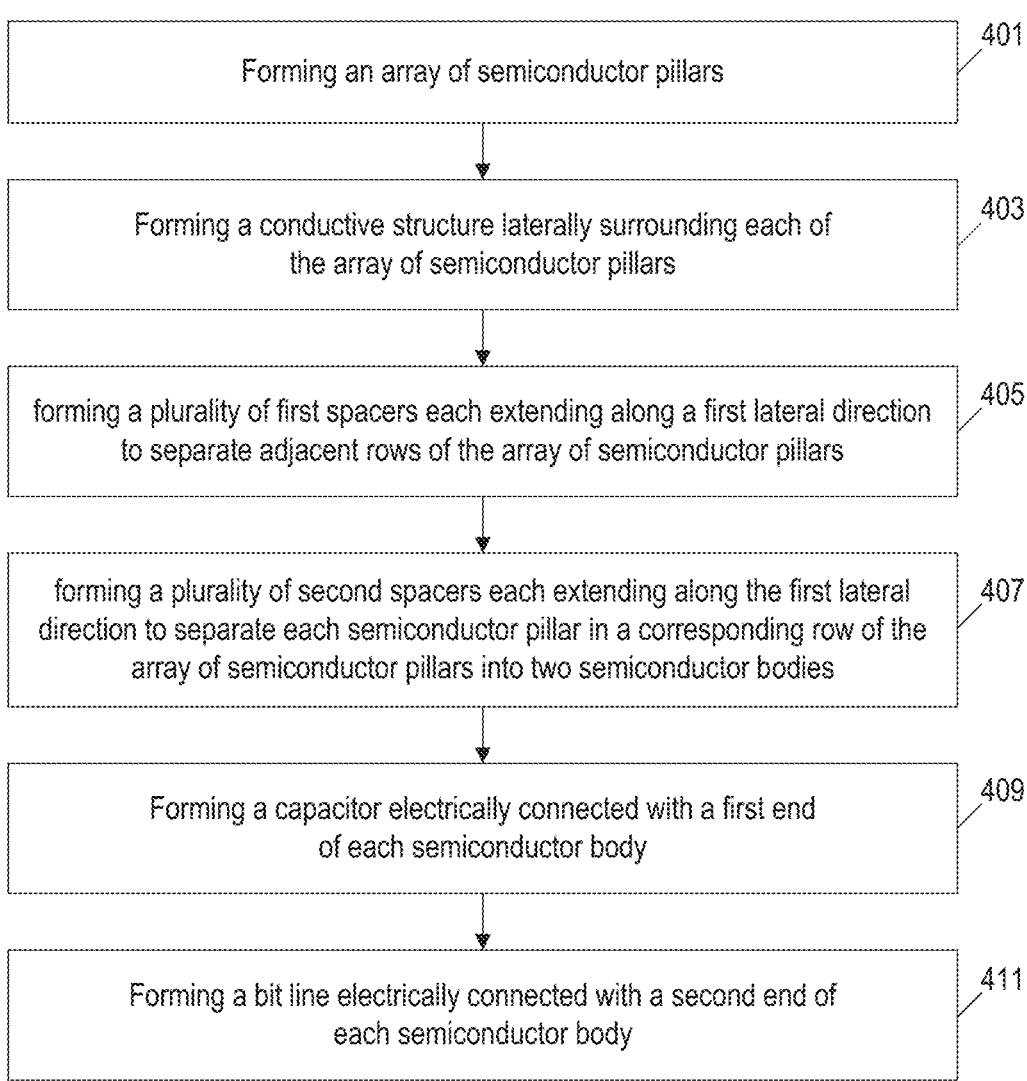

Forming an array of semiconductor pillars — 401

Forming a conductive structure laterally surrounding each of the array of semiconductor pillars — 403 forming a plurality of first spacers each extending along a first lateral direction to separate adjacent rows of the array of semiconductor pillars — 405 forming a plurality of second spacers each extending along the first lateral direction to separate each semiconductor pillar in a corresponding row of the array of semiconductor pillars into two semiconductor bodies — 407

Forming a capacitor electrically connected with a first end of each semiconductor body — 409

Forming a bit line electrically connected with a second end of each semiconductor body — 411

1108 — HOST

1102

1106

1104

MEMORY CONTROLLER

MEMORY DEVICE

1

MEMORY DEVICES HAVING VERTICAL TRANSISTORS AND FABRICATING METHODS THEREOF

CROSS-REFERENCE TO RELATED APPLICATIONS

This application claims the benefit of priorities to U.S. Provisional Application No. 63/340,150, filed on May 10, 2022, U.S. Provisional Application No. 63/343,840, filed on May 19, 2022, and Chinese Application No. 202310524576.7, filed on May 8, 2023, all of which are hereby incorporated by reference in their entireties.

TECHNICAL FIELD

The present disclosure generally relates to the field of semiconductor technology, and more particularly, to memory devices and fabrication methods thereof.

BACKGROUND

Planar memory cells are scaled to smaller sizes by improving process technology, circuit design, programming algorithm, and fabrication process. However, as feature sizes of the memory cells approach a lower limit, planar process, and fabrication techniques become challenging and costly. As a result, memory density for planar memory cells approaches an upper limit.

A three-dimensional (3D) memory architecture can address the density limitation in planar memory cells. The 3D memory architecture includes a memory array and peripheral circuits for facilitating operations of the memory array.

SUMMARY

In some implementations, a semiconductor device comprises: an array of memory cells, each memory cell comprising: a capacitor; and a vertical transistor. The vertical transistor comprises: a semiconductor body extending in a vertical direction and in contact with the capacitor, and a three-sided gate structure surrounding the semiconductor body from three lateral directions.

In some implementations, the three-sided gate structure surrounds a curved sidewall of the semiconductor body.

In some implementations, the three-sided gate structures of a row of the vertical transistors along a first lateral direction are connected with each other to form a word line extending along the first lateral direction, and the three lateral directions include at least two opposite lateral directions along the first lateral direction.

In some implementations, the semiconductor device further comprises: a plurality of first and second spacers each extending along the first lateral direction between rows of the vertical transistors.

In some implementations, the plurality of first and second spacers are alternatively arranged along a second lateral direction perpendicular to the first lateral direction.

In some implementations, the semiconductor body of one vertical transistor comprises a curved sidewall and a flat sidewall.

In some implementations, each first spacer is located between the curved sidewalls of the semiconductor bodies of two adjacent rows of vertical transistors.

2

In some implementations, each second spacer is located between the flat sidewalls of the semiconductor bodies of two adjacent rows of vertical transistors.

In some implementations, the semiconductor bodies are aligned along the second lateral direction.

In some implementations, the semiconductor bodies are aligned along a third lateral direction with a non-zero angle with respect to the first lateral direction.

In some implementations, the semiconductor device further comprises: a gate dielectric layer between the three-sided gate structure and the curved sidewall of the semiconductor body.

In some implementations, the semiconductor device further comprises a plurality of bit lines arranged in parallel along the second lateral direction. The capacitors are connected to first ends of the semiconductor bodies, and the bit lines are connected to second ends of the semiconductor bodies opposite to the first ends.

In some implementations, a method of forming a semiconductor device, comprises: forming an array of semiconductor pillars; forming a conductive structure laterally surrounding each of the array of semiconductor pillars; forming a plurality of first spacers each extending along a first lateral direction to separate adjacent rows of the array of semiconductor pillars; and forming a plurality of second spacers each extending along the first lateral direction to separate each semiconductor pillar in a corresponding row of the array of semiconductor pillars into two semiconductor bodies; wherein the conductive structure is divided by the plurality of first and second spacers into a plurality of word lines, each word line extending along the first lateral direction and comprising a plurality of three-sided gate structures each surrounding three sides of a corresponding semiconductor body.

In some implementations, forming the array of semiconductor pillars comprises: forming a plurality of first trenches in a semiconductor layer each extending along the first lateral direction; and forming a plurality of second trenches in the semiconductor layer each extending along a second lateral direction different from the first lateral direction; and removing portions of an upper portion of the semiconductor layer to form the array of semiconductor pillars, wherein each semiconductor pillar has a curved sidewall, rows of the array of semiconductor pillars are separated by the plurality of first trenches, and columns of the array of semiconductor pillars are separated by the plurality of second trenches.

In some implementations, the first lateral direction is perpendicular to the second lateral direction.

In some implementations, the first lateral direction is not perpendicular to the second lateral direction.

In some implementations, forming the conductive structure comprises: forming a base dielectric structure in the plurality of first trenches and second trenches to laterally surround each of the array of semiconductor pillars; removing an upper portion of the base dielectric structure to expose an upper portion of each of the array of semiconductor pillars; forming a gate dielectric layer on an exposed sidewall of each of the array of semiconductor pillars; and forming the conductive structure to laterally surround the gate dielectric layer of each of the array of semiconductor pillars.

In some implementations, forming the plurality of first and second spacers comprises: forming a plurality of third trenches in the conductive structure, each extending along the first lateral direction and between adjacent rows of the array of semiconductor pillars; forming a plurality of fourth trenches in the conductive structure and the array of semiconductor pillars, each fourth trench extending along the first lateral direction to divide each semiconductor pillar of the corresponding row of the array of semiconductor pillars into the two semiconductor bodies; forming the plurality of first spacers in the plurality of third trenches; and forming the plurality of second spacers in the plurality of fourth trenches.

In some implementations, the method further comprises: forming a first doped region at a first end of each semiconductor body; forming a capacitor in electrical connection with the first doped region; forming a second doped region at a second end of each semiconductor body opposite to the first end; and forming a bit line in electrical connection with the second doped region.

In some implementations, a memory system comprises: an array of memory cells, each memory cell comprising: a capacitor; and a vertical transistor comprising: a semiconductor body extending in a vertical direction and in contact with the capacitor, and a three-sided gate structure surrounding the semiconductor body from three lateral directions including at least two opposite lateral directions; and a memory controller configured to control the array of memory cells.

BRIEF DESCRIPTION OF THE DRAWINGS

The accompanying drawings, which are incorporated herein and form a part of the specification, illustrate implementations of the present disclosure and, together with the description, further serve to explain the principles of the present disclosure and to enable a person skilled in the pertinent art to make and use the present disclosure.

FIG. 2A illustrates a schematic plan view of an array of memory cells each including a vertical transistor in an exemplary memory device, according to some implementations of the present disclosure.

FIG. 4 illustrates a flowchart of an exemplary fabricating method for forming a 3D memory device including vertical transistors, according to some implementations of the present disclosure.

Figure 1:
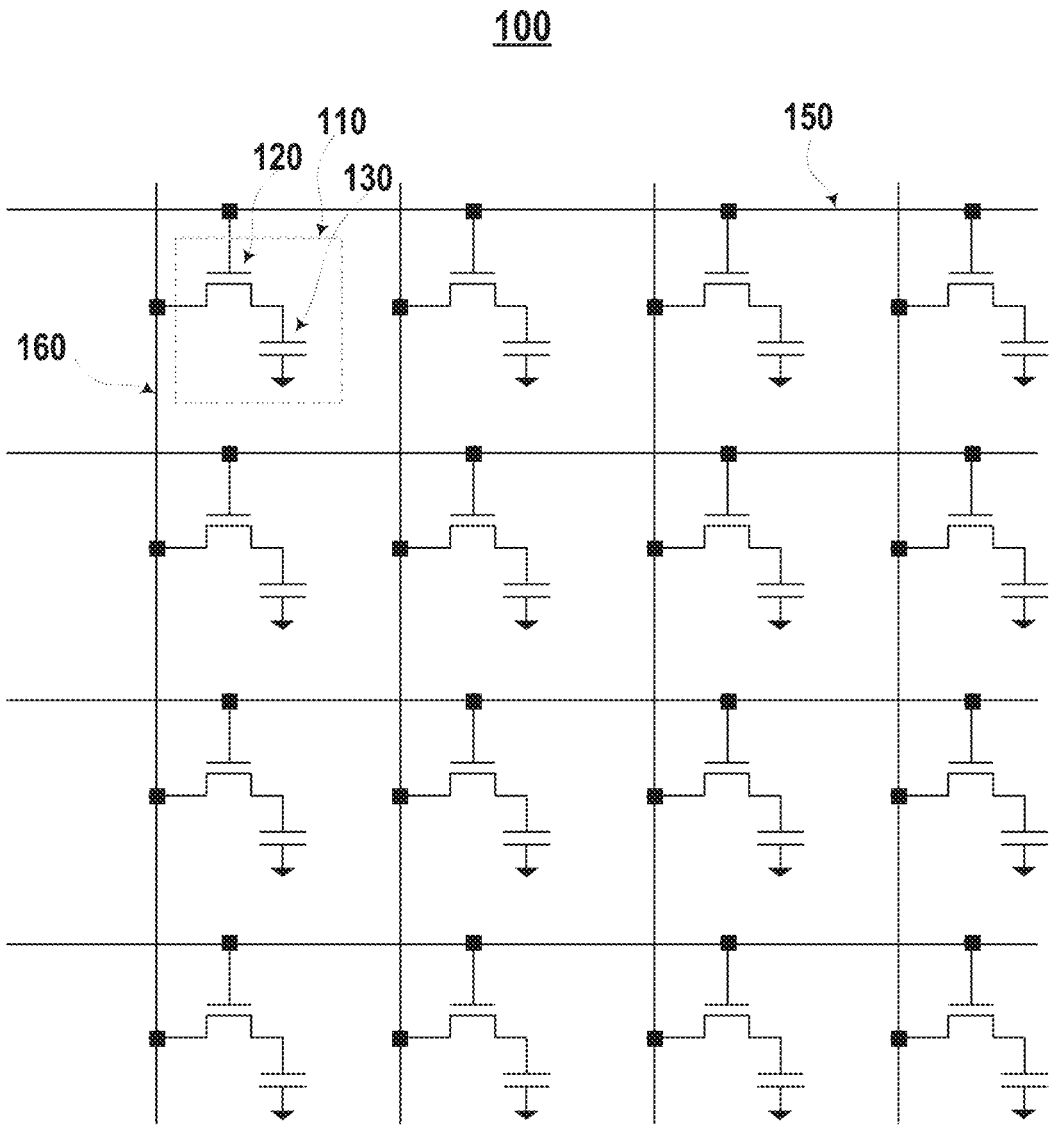
FIG. 1 illustrates a schematic circuit diagram of an exemplary memory device including an array of memory cells each having a vertical transistor, according to some implementations of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers. For example, an interconnect layer can include one or more conductors and contact layers (in which interconnect lines and/or vertical interconnect access (via) contacts are formed) and one or more dielectric layers.

Transistors are used as the switch or selecting devices in the memory cells of some memory devices, such as DRAM, PCM, and ferroelectric DRAM (FRAM). However, the planar transistors commonly used in existing memory cells usually have a horizontal structure with buried word lines in the substrate and bit lines above the substrate. Since the source and drain of a planar transistor are disposed laterally at different locations, which increases the area occupied by the transistor. The design of planar transistors also complicates the arrangement of interconnected structures, such as word lines and bit lines, coupled to the memory cells, for example, limiting the pitches of the word lines and/or bit lines, thereby increasing the fabrication complexity and reducing the production yield. Moreover, because the bit lines and the storage units (e.g., capacitors or PCM elements) are arranged on the same side of the planar transistors (above the transistors and substrate), the bit line process margin is limited by the storage units, and the coupling capacitance between the bit lines and storage units, such as capacitors, are increased. Planar transistors may also suffer from a high leakage current as the saturated drain current keeps increasing, which is undesirable for the performance of memory devices.

To address one or more of the aforementioned issues, the present disclosure introduces a solution in which vertical transistors replace the conventional planar transistors as the switch and selecting devices in a memory cell array of memory devices (e.g., DRAM, PCM, and FRAM). In the following descriptions, DRAM is used as a non-exclusive example of the present disclosure. Compared with planar transistors, the vertically arranged transistors (i.e., the drain and source are overlapped in the plan view) can reduce the area of the transistor as well as simplify the layout of the interconnect structures, e.g., metal wiring the word lines and bit lines, which can reduce the fabrication complexity and improve the yield. For example, the pitches of word lines and/or bit lines can be reduced for ease of fabrication. The vertical structures of the transistors also allow the bit lines and storage units, such as capacitors, to be arranged on opposite sides of the transistors in the vertical direction (e.g., one above and one below the transistors), such that the process margin of the bit lines can be increased and the coupling capacitance between the bit lines and the storage units can be decreased.

Consistent with the scope of the present disclosure, according to some implementations of the present disclosure, the memory cell array having vertical transistors each comprising a semiconductor structure extending in a vertical direction, and a three-sided gate structure surrounding the semiconductor structure from three lateral directions. The three-sided gate structure can have a larger gate control area to achieve better channel control with a smaller subthreshold swing. During the off state, since the channel is fully depleted, the leakage current of multi-gate transistors can be significantly reduced as well. Thus, using three-sided gate vertical transistors instead of planar transistors can achieve a much better speed (saturated drain current)/leakage current performance.

In some implementations, the word lines and bit lines are disposed close to the bonding interface due to the vertically arranged transistors, which can be coupled to the peripheral circuits through a large number (e.g., millions) of parallel bonding contacts across the bonding interface can make direct, short-distance (e.g., micron-level) electrical connections between the memory cell array and peripheral circuits to increase the throughput and input/output (I/O) speed of the memory devices. In some implementations, the memory cell array and the peripheral circuits can be formed separately on different wafers, such that the fabricating processes of the memory cell array and the peripheral circuits do not affect each other, and the memory area efficiency can be increased.

In some implementations, the three-sided gate vertical transistors disclosed herein are formed by splitting all-around gate transistors using trench isolations extending along the word line direction. Thus, the memory cell density in the bit line direction can be significantly increased (e.g., doubled) without unduly complicating the fabrication process compared with using processes, such as self-aligned double patterning (SADP). Also, the three-sided gate vertical transistors have a larger process window for word line, bit line, and transistor pitch reduction, compared to conventional planar transistors.

FIG. 1 illustrates a schematic diagram of an exemplary memory device 100 having an array of memory cells each having a vertical transistor, according to some implementations of the present disclosure. Memory device 100 can include a memory cell array in which each memory cell 110 includes a vertical transistor 120 and a storage unit coupled to vertical transistor 120. In some implementations as shown in FIG. 1, memory cell array is a DRAM cell array, and the storage unit is a capacitor 130 for storing charge as the binary information stored by the respective DRAM cell. In some other implementations not shown in the figures, memory cell array is a PCM cell array, and the storage unit can be a PCM element (e.g., including chalcogenide alloys) for storing binary information of the respective PCM cell based on the different resistivities of the PCM element in the amorphous phase and the crystalline phase. In some implementations not shown in the figures, memory cell array is a FRAM cell array, and the storage unit can be a ferroelectric capacitor for storing binary information of the respective FRAM cell based on the switch between two polarization states of ferroelectric materials under an external electric field.

As shown in FIG. 1, memory cells 110 can be arranged in a two-dimensional (2D) array having rows and columns. Memory device 100 can include word lines 150 coupling memory cell array to peripheral circuits for controlling the switch of vertical transistors 120 in memory cells 110 located in a row, as well as bit lines 160 coupling memory cell array to peripheral circuits for sending data to and/or receiving data from memory cells 110 located in a column. That is, each word line 150 is coupled to a respective row of memory cells 110, and each bit line 160 is coupled to a respective column of memory cells 110. In some implementations, the gate of vertical transistor 120 is coupled to word line 150, one of the source and the drain of vertical transistor 120 is coupled to bit line 160, the other one of the source and the drain of vertical transistor 120 is coupled to one electrode of capacitor 130, and the other electrode of capacitor 130 is coupled to the ground.

Figure 2B:
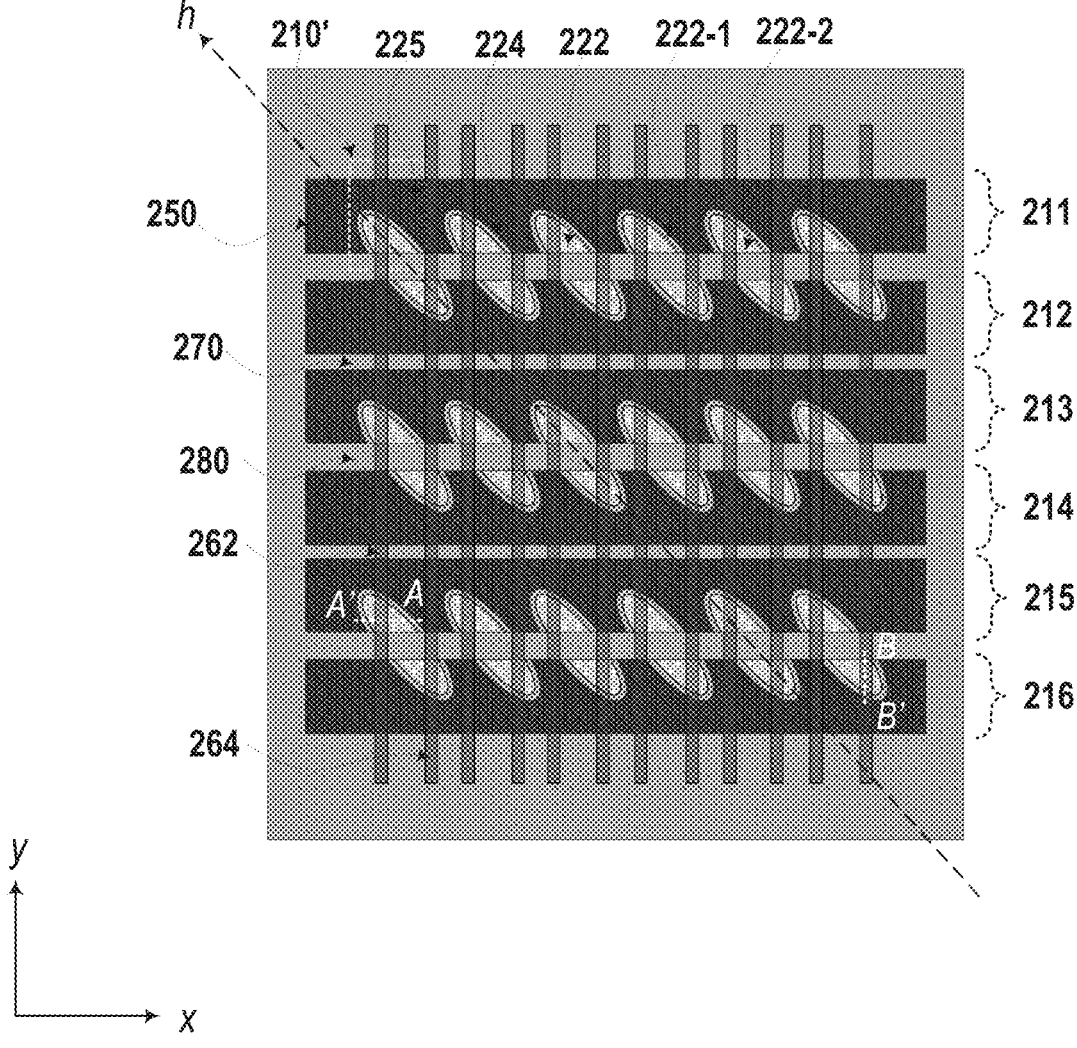
FIG. 2B illustrates a schematic plan view of an array of memory cells each including a vertical transistor in another exemplary memory device, according to some other implementations of the present disclosure.

Consistent with the scope of the present disclosure, vertical transistors 120, such as vertical metal-oxide-semiconductor field-effect transistors (MOSFETs), can replace the conventional planar transistors as the pass transistors of memory cells 110 to reduce the area occupied by the pass transistors, the coupling capacitance, as well as the interconnect routing complexity, as described below in detail. FIG. 2A illustrates a schematic plan view of an array of memory cells each including a vertical transistor in an exemplary memory device, according to some implementations of the present disclosure. FIG. 2B illustrates a schematic plan view of an array of memory cells each including a vertical transistor in another exemplary memory device, according to some other implementations of the present disclosure.

As shown in FIGS. 2A and 2B, memory device 200A/200B can include a plurality of word lines 250 each extending in a first lateral direction (the x-direction, referred to as the word line direction). Memory device 200A/200B can also include a plurality of bit lines 260 each extending in a second lateral direction perpendicular to the first lateral direction (the y-direction, referred to as the bit line direction). It is understood that FIGS. 2A and 2B do not illustrate cross-section views of memory device 200A/200B in the same lateral plane, and word lines 250 and bit lines 260 may be formed in different lateral planes for ease of routing as described below in detail.

Memory cells 210/210' can be formed at the intersections of word lines 250 and bit lines 260. In some implementations, each memory cell 210/210' includes a vertical transistor having a semiconductor body 222 and a gate structure

Figure 3A:
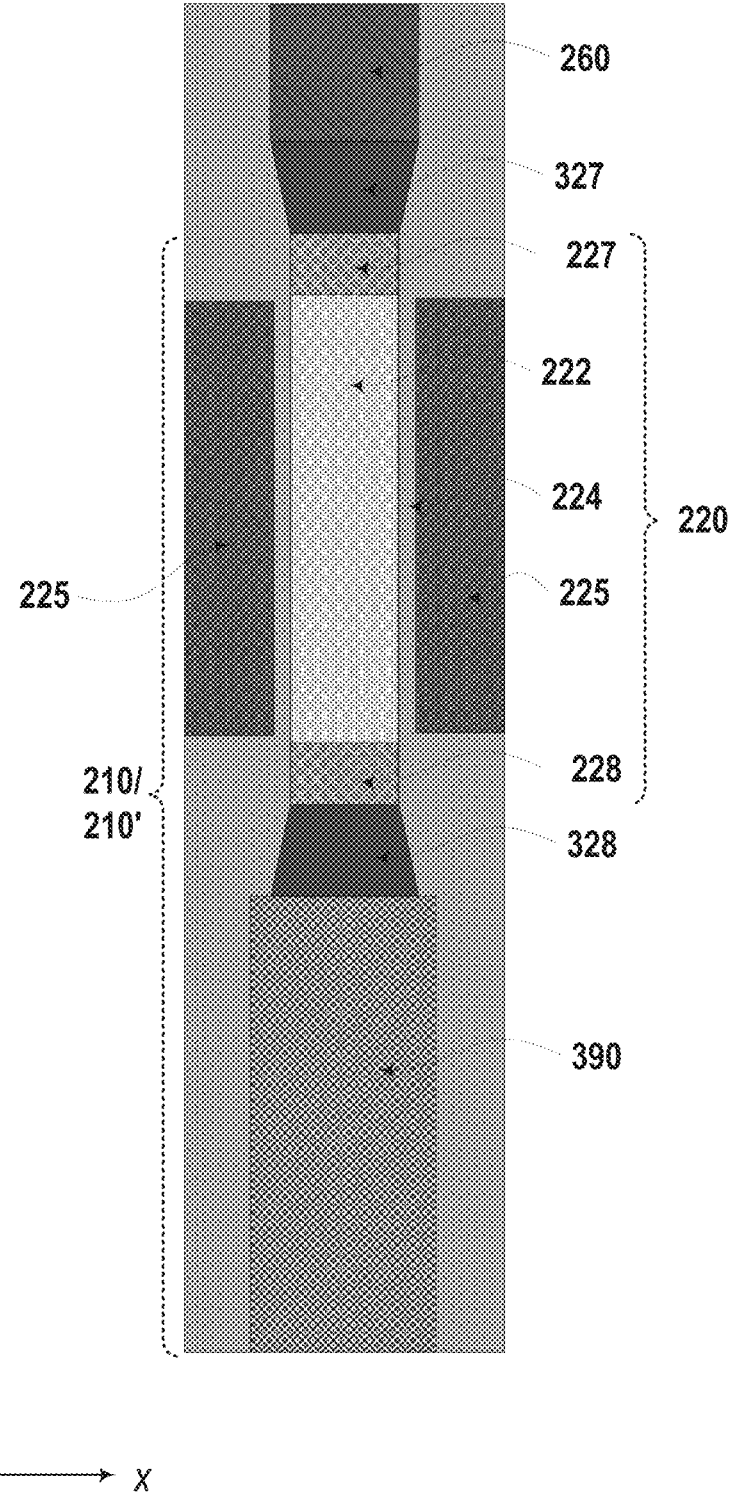
FIGS. 3A and 3B illustrate schematic side views of cross-sections of a memory cell including a vertical transistor in an exemplary 3D memory device, according to some implementations of the present disclosure.
Figure 3B:
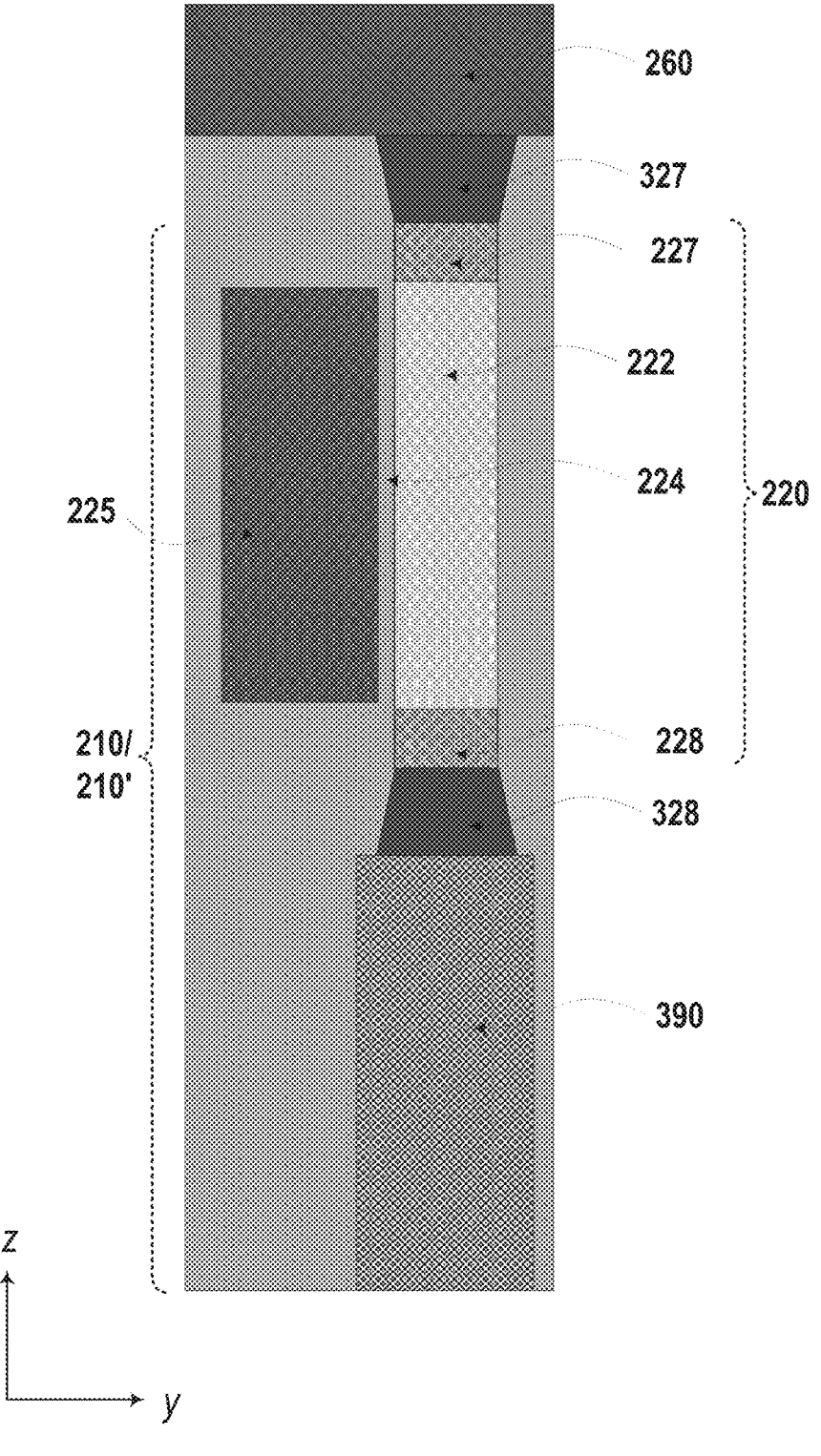

225. FIGS. 3A and 3B illustrate schematic side views of a cross-section of a memory cell including a vertical transistor in an exemplary 3D memory device, according to some implementations of the present disclosure. It is noted that FIG. 3A illustrates a cross-sectional side view of a memory cell 210 in FIG. 2A or a memory cell 210' in FIG. 2B along the AA' line, and FIG. 3B illustrates a cross-sectional side view of a memory cell 210 in FIG. 2A or a memory cell 210' in FIG. 2B along the BB' line.

Referring to FIGS. 2A-2B and 3A-3B, semiconductor body 222 can extend in the vertical direction (the z-direction, not shown) perpendicular to the first and second lateral directions. Different from planar transistors in which the active regions are formed in the substrates, vertical transistor 120 includes a semiconductor body 222 extending vertically (in the z-direction). It is understood that semiconductor body 222 may have any suitable 3D shape, such as polyhedron shapes or a cylinder shape. That is, the cross-section of semiconductor body 222 in the plan view (e.g., in the x-y plane) can have a square shape, a rectangular shape (or a trapezoidal shape), a circular shape, a partial circular shape, an oval shape, a partial oval shape, or any other suitable shapes. In the following descriptions, the cross-sections of semiconductor bodies 222 having a partial oval shape, as shown in FIGS. 2A and 2B are used as non-exclusive examples of the present disclosure. That is, in some implementations, semiconductor body 222 can include a flat sidewall 222-2 and a curved sidewall 222-1 in the vertical direction.

In some implementations, each vertical transistor 220 can also include a gate structure 225 surrounding multiple sides of semiconductor body 222, i.e., surrounding the active region from multiple lateral directions. In other words, the active region of vertical transistor 220, i.e., semiconductor body 222, can be at least partially surrounded by gate structure 225. For example, as shown in FIGS. 2A-2B and 3A-3B, the vertical transistor can be a three-sided gate transistor in which gate structure 225 surrounds semiconductor body 222 (the active region in which channels are formed) from three lateral directions. The three-sided gate structure 225 can surround the curved sidewall 222-1 of the semiconductor body 222.

Gate structure 225 can include any suitable conductive materials, such as polysilicon, metals (e.g., tungsten (W), copper (Cu), aluminum (Al), etc.), metal compounds (e.g., titanium nitride (TiN), tantalum nitride (TaN), etc.), or silicides. For example, gate structure 225 may include doped polysilicon, i.e., a gate poly. In some implementations, gate structure 225 includes multiple conductive layers, such as a W layer over a TiN layer. In some implementations, a gate dielectric 224 is laterally between the three-sided gate structure 225 and the curved sidewall 222-1 of the semiconductor body 222. Gate dielectric 224 can include any suitable dielectric materials, such as silicon oxide, silicon nitride, silicon oxynitride, or high-k dielectrics. For example, gate dielectric 224 may include silicon oxide, i.e., gate oxide.

As shown in FIGS. 2A and 2B, the three-sided gate structure 225 of adjacent vertical transistors 220 in the first lateral direction (i.e., the word line direction or the x-direction) are continuous, e.g., parts of a continuous conductive layer having three-sided gate structure 225. That is, multiple three-sided gate structures 225 of a row (e.g., 211-216) of vertical transistors 220 can be connected with each other and extending along the first lateral direction to form a word line 250 of the row of vertical transistors 220. In contrast, the gate dielectrics 224 of adjacent vertical transistors in the word line direction are separate, e.g., not parts of a continuous dielectric layer having gate dielectrics 224.

In the second lateral direction (i.e., the bit line direction or the y-direction), the three-sided gate structure 225 of adjacent vertical transistors 220 are separated by a plurality of first spacers 270 and second spacers 280 each extending along the first lateral direction between rows (e.g., 211-216) of the vertical transistors 220. In some implementations, each of the plurality of first spacers 270 and second spacers 280 can include a dielectric wall extending in the first lateral direction in parallel with word lines 250 to separate adjacent rows of vertical transistors 220. In some implementations, the plurality of first spacers 270 and second spacers 280 can include any suitable dielectric material, such as silicon oxide. In some implementations, each of the plurality of first spacers 270 and second spacers 280 can further include one or more air gaps (not shown) embedded in the dielectric wall. As described below with respect to the fabrication process, the air gaps may be formed due to the relatively small pitches of word lines 250 (and rows of DRAM cells 210) along the second lateral direction. On the other hand, the relatively large dielectric constant of air in air gaps (e.g., about 4 times the dielectric constant of silicon oxide) can improve the insulation effect between word lines 250 (and rows of DRAM cells 210) compared with some dielectrics (e.g., silicon oxide).

As shown in FIGS. 2A and 2B, the plurality of first spacers 270 and second spacers 280 are alternatively arranged along the second lateral direction. Each first spacer 270 is located between the curved sidewalls 222-1 of the semiconductor bodies 222 of two adjacent rows of vertical transistors 220. Each second spacer 280 is located between the flat sidewalls 222-2 of the semiconductor bodies 222 of two adjacent rows of vertical transistors 220.

As shown in FIG. 2A, in some implementations, the semiconductor bodies 222 are aligned along the second lateral direction. Specifically, the semiconductor bodies 222 of adjacent vertical transistors 220 separated by a second spacer 280 can be portions of an oval shape having a longitudinal axis along the second lateral direction. Each bit line 260 extending along the second lateral direction can be connected with the semiconductor bodies 222 of a column of vertical transistors 220. As shown in FIG. 2B, in some other implementations, the semiconductor bodies 222 are aligned along a third lateral direction (e.g., h-direction as shown in FIG. 2B) with non-zero angles in respect to the first lateral direction and the second lateral direction. Specifically, the semiconductor bodies 222 of adjacent vertical transistors 220 separated by a second spacer 280 can be portions of an oval shape having a longitudinal axis along the third lateral direction. A plurality of first bit lines 262 extending along the second lateral direction can be connected with the semiconductor bodies 222 of a column of vertical transistors 220 belonging to odd rows (e.g., 211, 213, 215 as shown in FIG. 2B) of vertical transistors 220. A plurality of second bit lines 264 arranged alternatively parallel with the first bit lines 262 can be connected with the semiconductor bodies 222 of a column of vertical transistors 220 belonging to even rows (e.g., 212, 214, 216 as shown in FIG. 2B) of vertical transistors 220.

Referring to FIGS. 3A and 3B, each vertical transistor 220 can further include a pair of a source and a drain 227, 228 (S/D, dope regions, a.k.a., source electrode and drain electrode) formed at the two ends of semiconductor body 222 in the vertical direction (the z-direction), respectively. The source and drain 227, 228 can be doped with any suitable P-type dopants, such as boron (B) or Gallium (Ga), or any suitable N-type dopants, such as phosphorus (P) or arsenic (As). The source and drain 225-7, 225-8 can be located at opposite ends of semiconductor body 222 in the vertical direction (the z-direction). Gate structure 225 is formed vertically between the source and drain 227, 228. As a result, the channel of the vertical transistor 220 can be formed in semiconductor body 222 vertically between the source and drain 225-7, 225-8 when a gate voltage applied to the gate structure 225 is above a threshold voltage of the vertical transistor 220.

One of the source/drain 227 can be connected to a bit line 260 through a bit line contact 327, and the other one of the source/drain 228 can be connected to a storage unit (e.g., a capacitor 390 as shown in FIGS. 3A and 3B) through a storage unit contact 328. The storage unit can include any devices that are capable of storing binary data (e.g., 0 and 1), including but not limited to, capacitors for DRAM cells and FRAM cells, and PCM elements for PCM cells. In some implementations, each vertical transistor 220 controls the selection and/or the state switch of the respective storage unit coupled to vertical transistor 220.

In some implementations as shown in FIGS. 3A and 3B, the storage unit is a capacitor 390 including a first electrode (not shown) coupled with the source/drain 228 of vertical transistor 220. Capacitor 390 can also include a capacitor dielectric (not shown) in contact with the first electrode, and a second electrode (not shown) in contact with the capacitor dielectric. That is, capacitor 390 can be a vertical capacitor in which two electrodes and the capacitor dielectric in between are stacked vertically (in the z-direction), and the capacitor dielectric can be sandwiched between the two electrodes. In some implementations, each first electrode can be coupled to the source/drain 228 of a respective vertical transistor 220 in the same DRAM cell, while all second electrodes can be parts of a common plate coupled to the ground, e.g., a common ground. In some implementations, the capacitor dielectric includes dielectric materials, such as silicon oxide, silicon nitride, or high-k dielectrics including, but not limited to, $Al_2O_3$, $HfO_2$, $Ta_2O_5$, $ZrO_2$, $TiO_2$, or any combination thereof. In some implementations, the two electrodes can include conductive materials including, but not limited to, W, Co, Cu, Al, TiN, TaN, polysilicon, silicides, or any combination thereof.

It is understood that the capacitor 390 may include any suitable structure and configuration, such as a planar capacitor, a stack capacitor, a multi-fins capacitor, a cylinder capacitor, a trench capacitor, or a substrate-plate capacitor. That is, capacitor 390 can be a vertical capacitor in which two electrodes and the capacitor dielectric in between are stacked vertically (in the z-direction), and the capacitor dielectric can be sandwiched between the two electrodes. In some implementations, each first electrode can be coupled to the source/drain 228 of a respective vertical transistor 220 in the same DRAM cell, while all second electrodes can be parts of a common plate coupled to the ground, e.g., a common ground.

In some implementations, as shown in FIGS. 2A-2B and 3A-3B, each vertical transistor 220 is a three-sided gate transistor. That is, the three-sided gate structure 225 can partially surround the semiconductor body 222 from three lateral directions. It is noted that, the three lateral directions at least include two opposite lateral directions (e.g., positive and negative x-directions) and a perpendicular lateral direction (e.g., positive or negative y-direction) between the two opposite lateral directions. Thus, a larger active channel region can be formed between the source and drain in operation. That is, different from the planar transistor that includes only a single planar gate (and results in a single planar channel), vertical transistor 220 shown in FIGS. 2A-2B and 3A-3B can have a larger gate control area to achieve better channel control with a smaller subthreshold swing. During the off state, since the channel is fully depleted, the leakage current ($I_{off}$) of vertical transistor 220 can be significantly reduced.

In planar transistors and some lateral multiple-gate transistors (e.g., FinFET), the active regions, such as semiconductor bodies (e.g., Fins), extend laterally (in the x-y plane), and the source and the drain are disposed at different locations in the same lateral plane (the x-y plane). In contrast, in vertical transistor 220, semiconductor body 222 extends vertically (in the z-direction), and the source and the drain are disposed in the different lateral planes, according to some implementations. In some implementations, the source and the drain are formed at two ends of semiconductor body 222 in the vertical direction (the z-direction), respectively, thereby being overlapped in the plan view. As a result, the area (in the x-y plane) occupied by vertical transistor 220 can be reduced compared with planar transistor and lateral multiple-gate transistors. Also, the metal wiring coupled to vertical transistors 220 can be simplified as well since the interconnects can be routed in different planes. For example, bit lines 260 and storage units 212 may be formed on opposite sides of vertical transistor 120. In one example, bit line 206 may be coupled to the source/drain 227 at the upper end of semiconductor body 222, while the capacitor 390 may be coupled to the other source/drain 228 at the lower end of semiconductor body 222.

In some implementations, one or more peripheral circuits (not shown) can be coupled to memory cell array 200A/200B through bit lines 260, word lines 250, and any other suitable metal wirings. It is noted that the one or more peripheral circuits can include any suitable circuits for facilitating the operations of memory cell array 200A/200B by applying and sensing voltage signals and/or current signals through word lines 250 and bit lines 260 to and from each memory cell 210. The one or more peripheral circuits can include various types of peripheral circuits formed using CMOS technologies.

Figure 11:
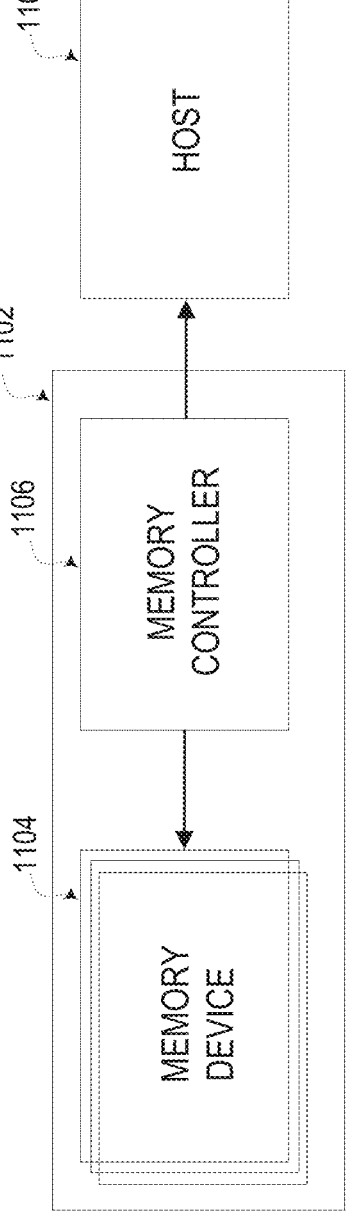
FIG. 11 illustrates a block diagram of an exemplary system having a memory device, according to some implementations of the present disclosure.

FIG. 11 illustrates a block diagram of a system 1100 having a memory device, according to some implementations of the present disclosure. System 1100 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 11, system 1100 can include a host 1108 and a memory system 1102 having one or more memory devices 1104 and a memory controller 1106. Host 1108 can be a processor of an electronic device, such as a central processing unit (CPU), or a system-on-chip (SoC), such as an application processor (AP). Host 1108 can be configured to send or receive the data to or from memory devices 1104. Memory device 1104 can be any memory devices disclosed herein, such as 3D memory device 100. In some implementations, memory device 1104 includes an array of memory cells 200A/200B each including a vertical transistor 220, as described above in detail.

Memory controller 1106 is coupled to memory device 1104 and host 1108 and is configured to control memory device 1104, according to some implementations. Memory controller 1106 can manage the data stored in memory device 1104 and communicate with host 1108. Memory controller 1106 can be configured to control operations of memory device 1104, such as read, write, and refresh operations. Memory controller 1106 can also be configured to manage various functions with respect to the data stored or to be stored in memory device 1104 including, but not limited to refresh and timing control, command/request translation, buffer and schedule, and power management. In some implementations, memory controller 1106 is further configured to determines the maximum memory capacity that the computer system can use, the number of memory banks, memory type and speed, memory particle data depth and data width, and other important parameters. Any other suitable functions may be performed by memory controller 1106 as well. Memory controller 1106 can communicate with an external device (e.g., host 1108) according to a particular communication protocol. For example, memory controller 1106 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

FIG. 4 illustrates a flowchart of an exemplary fabricating method 400 for forming a 3D memory device including vertical transistors, according to some implementations of the present disclosure. FIGS. 5A-5B, 6A-6B, 7A-7B, 8A-8B, 9A-9B, 10A-10B illustrate schematic plan views and schematic side cross-sectional views of an exemplary 3D memory device at certain fabricating stages of the method 400 shown in FIG. 4, according to various implementations of the present disclosure. It is understood that the operations shown in method 400 are not exhaustive and that other operations can be performed as well before, after, or between any of the illustrated operations. Further, some of the operations may be performed simultaneously, or in a different order than shown in FIG. 4.

As shown in FIG. 4, method 400 can start at operation 401, in which an array of semiconductor pillars can be formed. In some embodiments, the array of semiconductor pillars can be formed in an upper portion of a semiconductor layer. Each semiconductor pillar can extend vertically (in the z-direction) and have any suitable 3D shape, such as polyhedron shapes or a cylinder shape. That is, the cross-section of each semiconductor pillar in the plan view (e.g., in the x-y plane) can have a square shape, a rectangular shape (or a trapezoidal shape), a circular shape, an oval shape, or any other suitable shapes.

In some implementations, forming the array of semiconductor pillars can include forming a plurality of parallel first trenches in a first lateral direction and a plurality of parallel second trenches in a second lateral direction. As illustrated in a top view of FIG. 5A, a plurality of parallel first trenches 530 are formed in the first lateral direction (e.g., the x-direction, the word line direction), and a plurality of parallel second trenches 540 are formed in the second lateral direction (e.g., the y-direction, the bit line direction). The plurality of parallel first trenches 530 and second trenches 540 vertically extend into an upper portion of a semiconductor layer 510 (e.g., a silicon substrate) as illustrated in a side view of FIG. 5B along CC' line shown in FIG. 5A. The remaining portions of the upper portion of the semiconductor layer 510 form the array of semiconductor pillars 520.

In some implementations, a lithography process is performed to pattern first and second trenches 530 and 540 using an etch mask (e.g., a photoresist mask and/or a hard mask), and one or more dry etching and/or wet etching processes, such as RIE, are performed to etch first and second trenches 530 and 540 in the upper portion of the semiconductor layer 510. Thus, the array of semiconductor pillars 520 each extending vertically in the upper portion of the semiconductor layer 510 can be formed. Since semiconductor pillars 520 are formed by etching semiconductor layer 510, semiconductor pillars 520 can have the same material as semiconductor layer 510, such as single crystalline silicon.

Figure 5B:
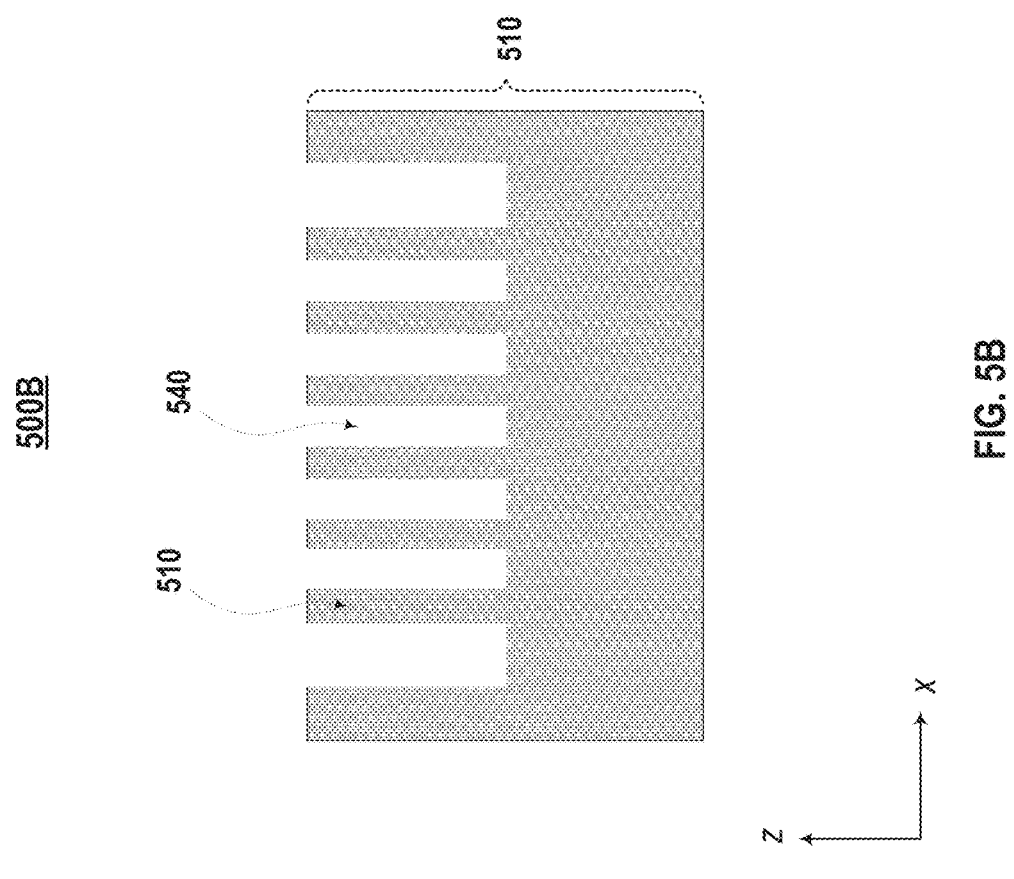
FIG. 5B illustrates a schematic side cross-sectional view of an exemplary 3D memory device at a certain fabricating stage of the method shown in FIG. 4, according to various implementations of the present disclosure.
Figure 5A:
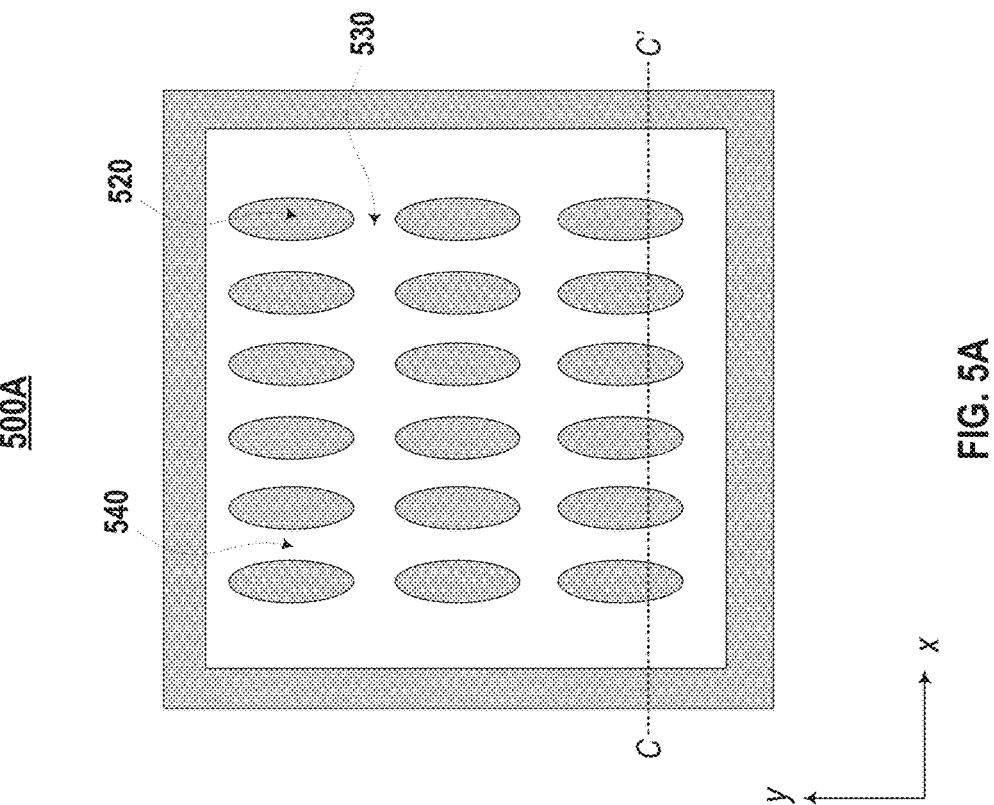
FIG. 5A illustrates a schematic plan view of an exemplary 3D memory device at a certain fabricating stage of the method shown in FIG. 4, according to various implementations of the present disclosure.

It is noted that, in FIG. 5A, the second trenches 540 each extends along the second lateral direction (y-direction), which is perpendicular to the first lateral direction (x-direction). That is, each second trench 540 can be perpendicular to each first trench 530. In some other implementations not shown in FIG. 5A, the second trenches 540 can each extend along a third lateral direction (e.g., h-direction as shown in FIG. 2B) with non-zero angles with respect to the first lateral direction (x-direction) and the second lateral direction (y-direction). That is, each second trench 540 can be non-perpendicular to each first trench 530.

In some implementations, forming the array of semiconductor pillars can further include rounding lateral corners of each of the array of semiconductor pillars. As shown in FIG. 5A, after forming the first and second trenches 530 and 540, a further etching process, such as wet etching, can be performed to remove lateral corners of each of the array of semiconductor pillars 520, such that each of the array of semiconductor pillars 520 has a curved sidewall. In some implementations, the cross-section of each semiconductor pillar in the plan view (e.g., in the x-y plane) can have a circular shape, an oval shape, or a square-like shape or a rectangular-like shape with rounded corners. In some implementations as shown in FIG. 5A, the cross-section of each semiconductor pillar in the plan view can have an oval shape with a longitudinal axis along the second lateral direction (y-direction). In some implementations not shown in FIG. 5A, the cross-section of each semiconductor pillar in the plan view can have an oval shape with a longitudinal axis along the third lateral direction (e.g., h-direction as shown in FIG. 2B).

Referring back to FIG. 4, method 400 can proceed to operation 403, in which a conductive structure can be formed in the first and second trenches to laterally surround each of the arrays of semiconductor pillars. In some implementations, the conductive structure can be isolated from the array of semiconductor pillars by a gate dielectric layer.

Figure 6A:
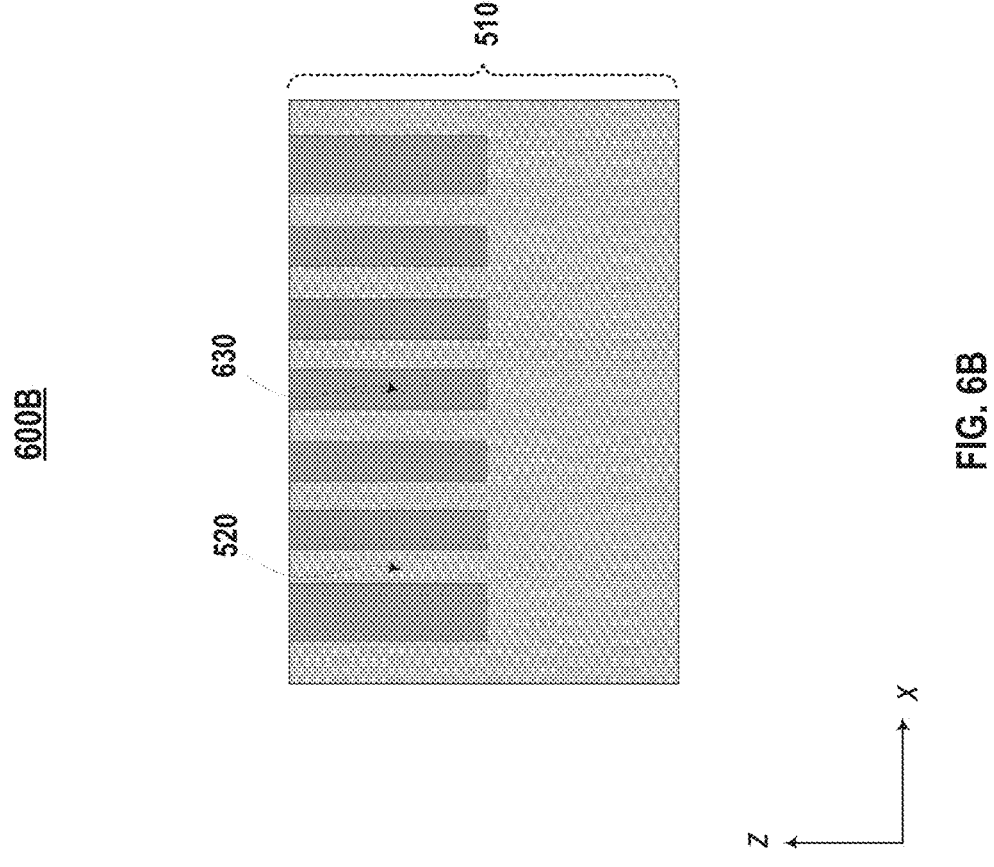
FIG. 6A illustrates a schematic plan view of an exemplary 3D memory device at a certain fabricating stage of the method shown in FIG. 4, according to various implementations of the present disclosure.
Figure 6B:
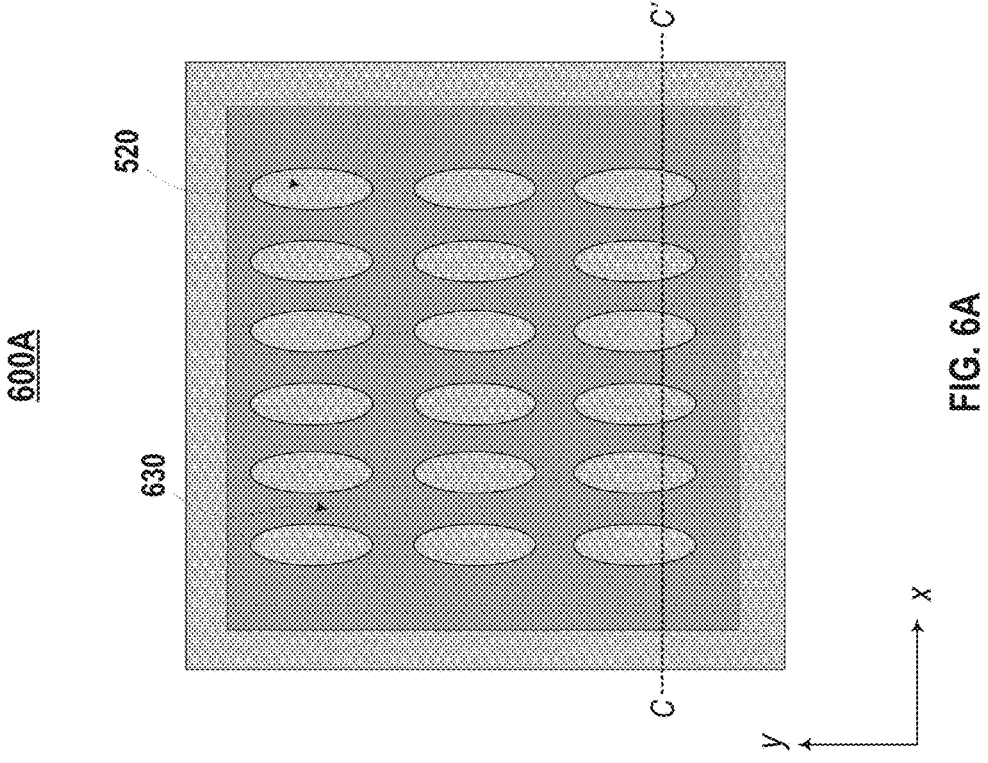
FIG. 6B illustrates a schematic side cross-sectional view of an exemplary 3D memory device at a certain fabricating stage of the method shown in FIG. 4, according to various implementations of the present disclosure.

In some implementations, forming the conductive structure can include forming a trench isolation structure in the first and second trenches. As shown in FIGS. 6A and 6B, a trench isolation structure 630 is formed in the first and second trenches 530 and 540. In some implementations, a dielectric, such as silicon oxide, is deposited to fully fill the first and second trenches 530 and 540 using one or more thin film deposition processes including, but not limited to, CVD, PVD, ALD, a spin coating process, or any combination thereof. In some implementations, a planarization process, such as CMP, is performed to remove excess dielectric deposited beyond the top surface of semiconductor layer 510. As a result, the array of semiconductor pillars can be laterally separated from each layer by the trench isolation structure 630. The trench isolation structure 630 can then be etched back, such that the remaining portion of the trench isolation structure 630 is located at a bottom portion of the first and second trenches 530 and 540, as shown in FIG. 7B.

In some implementations, a gate dielectric layer 724 can be formed to cover the exposed sidewalls of the semiconductor pillars 520. As illustrated in FIG. 7A, the gate dielectric layer 724 can surround the sidewall of each semiconductor pillars 520. In some implementations, the gate dielectric layer 724 is formed by depositing a layer of dielectric, such as silicon oxide, over the sidewalls of each semiconductor pillars 520 using one or more thin film deposition processes including, but not limited to, CVD, PVD, ALD, or any combination thereof. It some other implementations, the gate dielectric layer 724 is formed by a wet oxidation and/or a dry oxidation process, such as in situ steam generation (ISSG) oxidation, is performed to form native oxide (e.g., silicon oxide) on exposed sidewalls of the semiconductor pillars 520 (e.g., single crystalline silicon) as the gate dielectric layer 724.

After forming the gate dielectric layer, a conductive structure 740 is formed in the first and second trenches 530 and 540. In some implementations, to form the conductive structure 740, one or more conductive layers are deposited in the first and second trenches 530 and 540 and over the gate dielectric layer 724. In some implementations, the conductive structure 740 can be formed by depositing one or more conductive materials, such as metal and/or metal compounds (e.g., W and TiN), over the gate dielectric layer 724 using one or more thin film deposition processes including, but not limited to, CVD, PVD, ALD, or any combination thereof, to partially fill the first and second trenches 530 and 540. For example, layers of TiN and W may be sequentially deposited to form the conductive structure 740. A planarization process, e.g., CMP, can be performed to remove the excess conductive materials over the top surface of semiconductor layer 510.

Figure 7B:
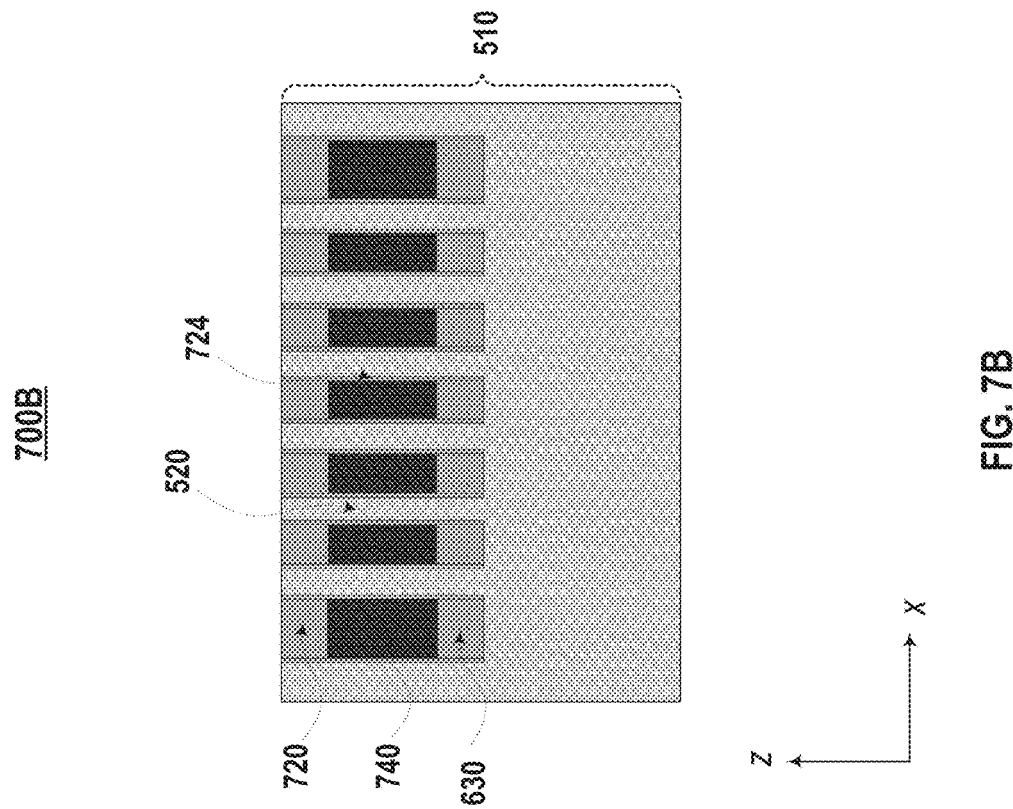
FIG. 7B illustrates a schematic side cross-sectional view of an exemplary 3D memory device at a certain fabricating stage of the method shown in FIG. 4, according to various implementations of the present disclosure.
Figure 7A:
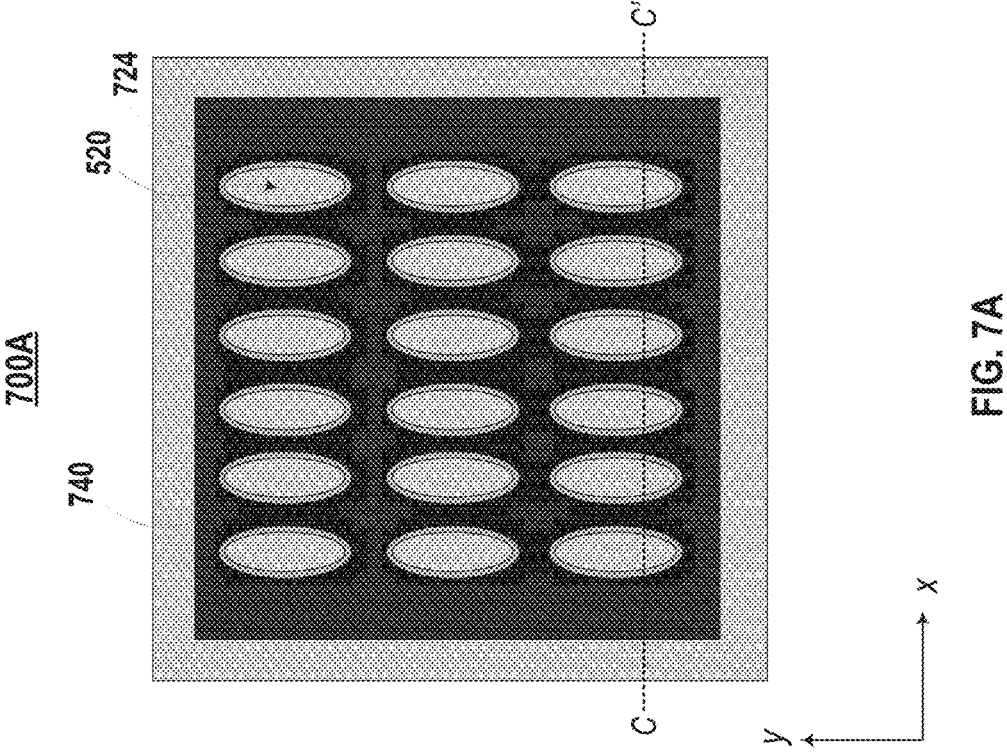
FIG. 7A illustrates a schematic plan view of an exemplary 3D memory device at a certain fabricating stage of the method shown in FIG. 4, according to various implementations of the present disclosure.

As illustrated in FIG. 7B along the CC' line shown in FIG. 7A, in some implementations, the conductive structure 740 is etched back, for example, using dry etch and/or wet etch (e.g., RIE), to form dents, such that the upper end of the conductive structure 740 is below the top surface of semiconductor pillars 520. In some implementations, as the gate dielectric layer 724 is not etched back, the upper end of the conductive structure 740 is below the upper end of the gate dielectric layer 724 as well, which is flush with the top surface of semiconductor pillars 520. In some implementations, as shown in FIG. 7B, a dielectric layer 720 is formed in the remaining space of first and second trenches 530 and 540 as well as the dents (not shown) resulting from etching back of the conductive structure 740, for example, by depositing a dielectric, such as silicon oxide, using one or more thin film deposition processes including, but not limited to, CVD, PVD, ALD, or any combination thereof.

Referring back to FIG. 4, method 400 can then proceed to operation 405, in which a plurality of first spacers each extending along a first lateral direction can be formed to separate adjacent rows of the array of semiconductor pillars, as well as operation 407, in which a plurality of second spacers each extending along the first lateral direction can be formed to separate each semiconductor pillar in a corresponding row of the array of semiconductor pillars into two semiconductor bodies.

In some implementations, a plurality of first spacers 870 each vertically extending between adjacent rows of the semiconductor pillars 520 and laterally extending parallel along the first lateral direction (x-direction) can be formed to separate the conductive structure 740 into multiple conductive segments along the second lateral direction (y-direction). In some implementations, to form the plurality of first spacers 870, the conductive structure 740 is patterned and etched to form a plurality of third trenches each vertically extending between adjacent rows of the semiconductor pillars 520 and laterally extending parallel along the first lateral direction (x-direction), and a dielectric material is deposited to fill the multiple third trenches.

In some implementations, a plurality of second spacers 880 each vertically extending through a corresponding row of the semiconductor pillars 520 and laterally extending parallel along the first lateral direction (x-direction) can be formed to separate the row semiconductor pillar into multiple semiconductor bodies 820. In some implementations, to form the plurality of second spacers 880, the conductive structure 740 and the array of semiconductor pillars 520 are patterned and etched to form a plurality of fourth trenches each vertically extending through a corresponding row of the semiconductor pillars 520 and laterally extending parallel along the first lateral direction (x-direction), and a dielectric material is deposited to fill the multiple fourth trenches.

In some implementations, operations 405 and 407 can be performed simultaneously by a single lithography process to pattern third and fourth trenches on the conductive structure 740 and the array of semiconductor pillars 520 using an etch mask (e.g., a photoresist mask and/or a hard mask), and one or more dry etching and/or wet etching processes, such as RIE, are performed on the conductive structure 740 and the array of semiconductor pillars 520 to etch third and fourth trenches. The etching can be controlled such that the bottom of the third and fourth trenches can be flush with or below the bottom surface of semiconductor pillars 520. Then the first and second spacers 870 and 880 can be formed simultaneously, for example, by depositing a dielectric material, such as silicon oxide, to fill the third and fourth trenches, using one or more thin film deposition processes including, but not limited to, CVD, PVD, ALD, or any combination thereof. A planarization process can be performed to remove excess dielectric over the top surface of the semiconductor layer 510.

In some implementations, forming the plurality of first spacers 870 and second spacers 880 can include forming one or more air gaps (not shown) embedded in the dielectric material. The one or more air gaps can be formed due to the relatively small pitches of the first spacers 870 and second spacers 880 along the second lateral direction. The relatively large dielectric constant of air in air gaps (e.g., about 4 times the dielectric constant of silicon oxide) can improve the insulation effect between separated conductive material(s) and semiconductive material(s) compared with some dielectrics (e.g., silicon oxide).

As a result, in the second lateral direction (y-direction), the plurality of first spacers 870 and second spacers 880 are alternatively formed. Each row of semiconductor pillars 520 can be separated into two rows of semiconductor bodies 820 by a corresponding second spacer 880. The conductive structure 740 can be separated by the plurality of first spacers 870 and second spacers 880 into a plurality of word lines 850. Each word line 850 can include a plurality of the three-sided gate structure (e.g., three-sided gate structure 225) each surrounds a curved sidewall of one of a corresponding row of semiconductor bodies 820 aligned along the first lateral direction (x-direction). Accordingly, each first spacer 870 is formed between the curved sidewalls of the semiconductor bodies 222 of two adjacent rows of semiconductor bodies 820, and each second spacer 880 is formed between the flat sidewalls of the semiconductor bodies 820 of two adjacent rows of semiconductor bodies 820.

Figure 8B:
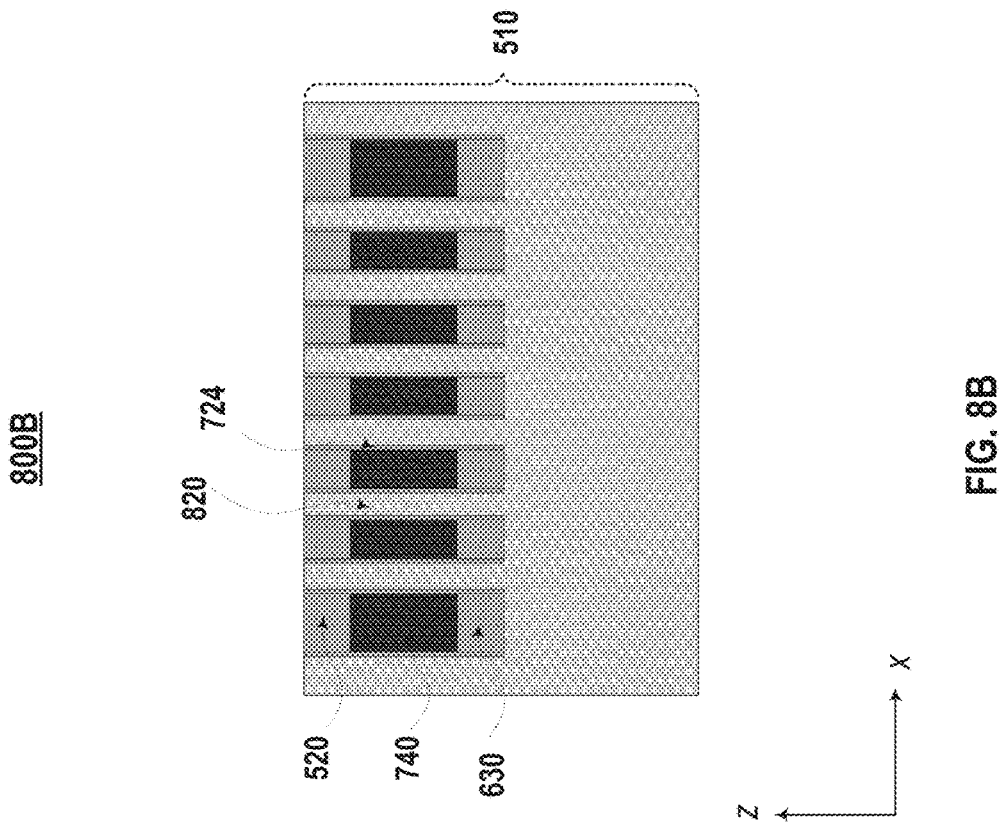
FIG. 8B illustrates a schematic side cross-sectional view of an exemplary 3D memory device at a certain fabricating stage of the method shown in FIG. 4, according to various implementations of the present disclosure.
Figure 8A:
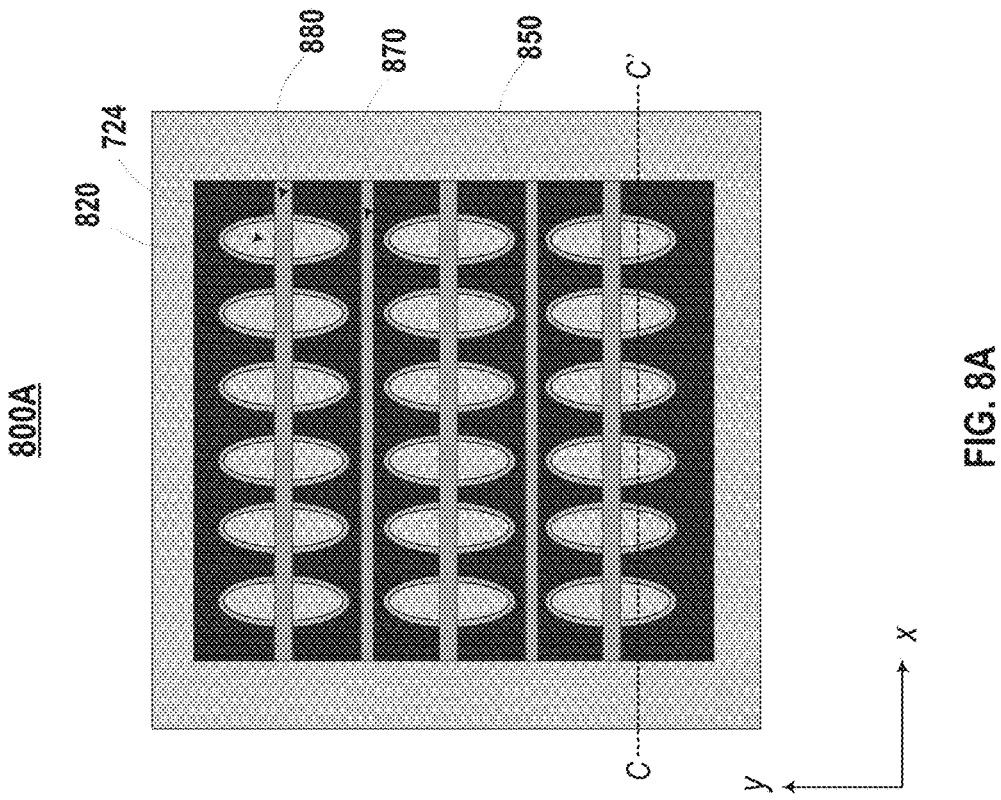
FIG. 8A illustrates a schematic plan view of an exemplary 3D memory device at a certain fabricating stage of the method shown in FIG. 4, according to various implementations of the present disclosure.

In some implementations as shown in FIG. 8A, the semiconductor bodies 820 are aligned along the second lateral direction (y-direction). Specifically, the semiconductor bodies 820 separated by a second spacer 880 can be portions of an oval shape having a longitudinal axis along the second lateral direction (y-direction). In some other implementations (not shown in FIG. 8A), the semiconductor bodies 820 can be aligned along a third lateral direction (e.g., h-direction as shown in FIG. 2B) with non-zero angles in respect to the first lateral direction and the second lateral direction. Specifically, the adjacent semiconductor bodies 820 separated by a second spacer 880 can be portions of an oval shape having a longitudinal axis along the third lateral direction.

Referring back to FIG. 4, method 400 can then proceed to operation 409, in which a plurality of storage units can be formed to electrically coupled with a first end of each semiconductor body.

Figure 9B:
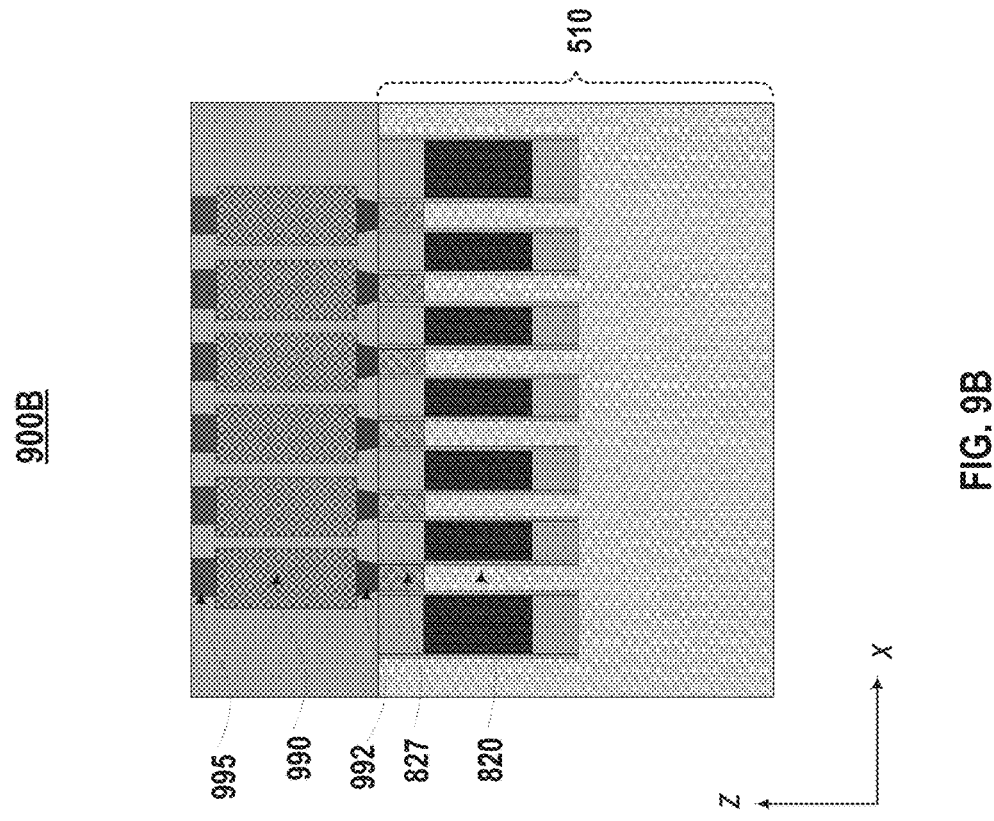
FIG. 9B illustrates a schematic side cross-sectional view of an exemplary 3D memory device at a certain fabricating stage of the method shown in FIG. 4, according to various implementations of the present disclosure.
Figure 9A:
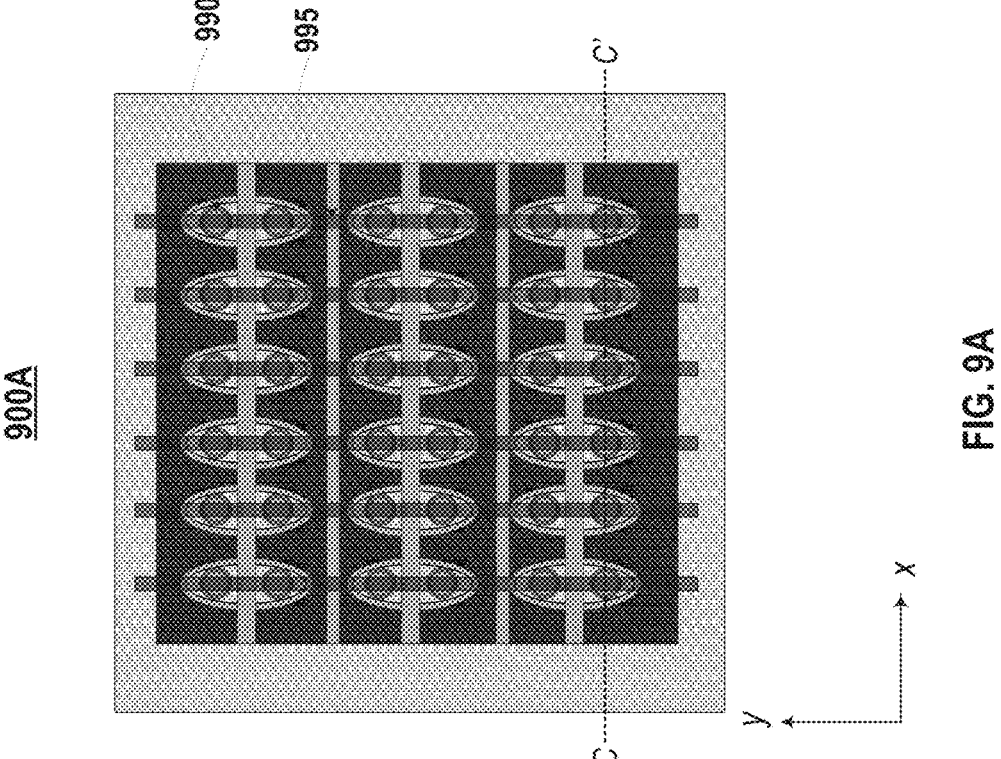
FIG. 9A illustrates a schematic plan view of an exemplary 3D memory device at a certain fabricating stage of the method shown in FIG. 4, according to various implementations of the present disclosure.

In some implementations as shown in FIGS. 9A and 9B, first ends (e.g., upper ends) of the semiconductor bodies 820 can be doped. As illustrated in FIG. 9B, the exposed upper end of each semiconductor body 820, i.e., one of the two ends of semiconductor body 820 in the vertical direction (the z-direction), is doped to form a source/drain 827. In some implementations, an implantation process and/or thermal diffusion process are performed to dope P-type dopants or N-type dopants to exposed upper ends of semiconductor bodies 820 to form sources/drains 827. In some implementations, a silicide layer is formed on source/drain 827 by performing a silicidation process at the exposed upper ends of semiconductor bodies 820.

In some implementations, a plurality of storage units are coupled with the semiconductor bodies, e.g., the source/drain 827 thereof through a storage unit contact, are formed. Each storage unit can include a capacitor 990 or a PCM element (not shown). In some implementations as shown in FIG. 9B, to form a storage unit that is a capacitor 990, a first electrode is formed on the doped first end of the semiconductor body, a capacitor dielectric is formed on the first electrode, and a second electrode is formed on the capacitor dielectric. A common source/drain line 995 can be formed to couple the capacitors 990 through storage unit contacts 992 in a column of vertical transistors. In some implementations, the common source/drain line 995 can be formed on capacitor dielectrics by patterning and etching an electrode hole aligned with respective capacitor dielectrics using lithography and etching processes and depositing conductive materials to fill the electrode hole using thin film deposition processes.

Referring back to FIG. 4, method 400 can then proceed to operation 411, in which a bit line can be formed to electrically couple with a second end of each semiconductor body.

Figure 10B:
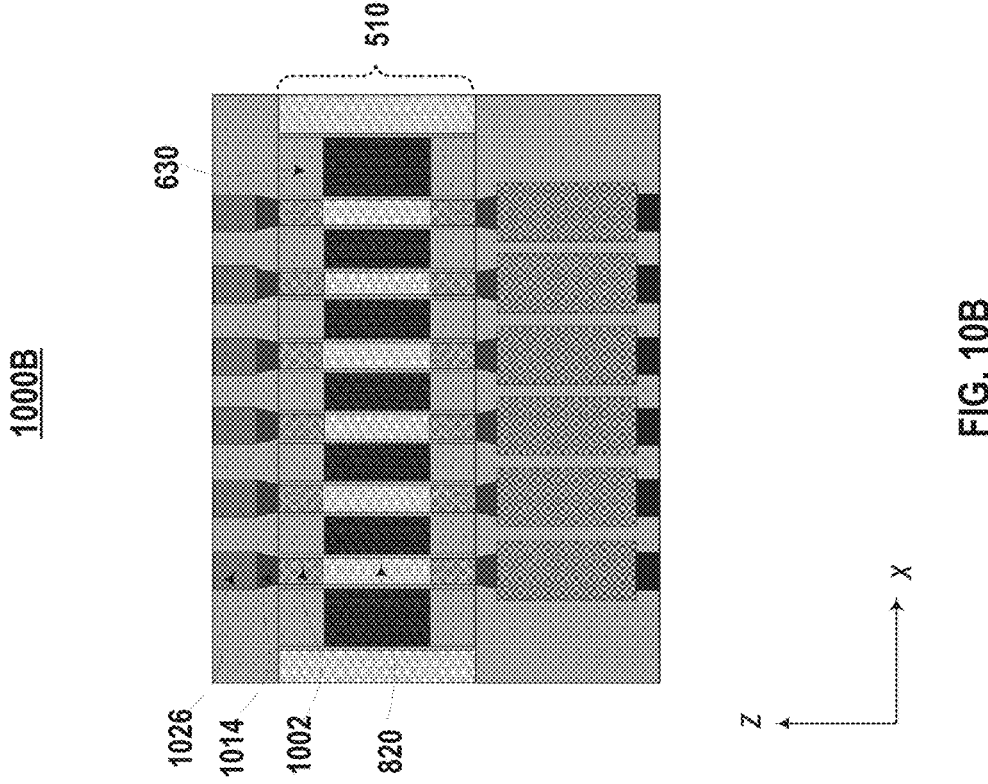
FIG. 10B illustrates a schematic side cross-sectional view of an exemplary 3D memory device at a certain fabricating stage of the method shown in FIG. 4, according to various implementations of the present disclosure.
Figure 10A:
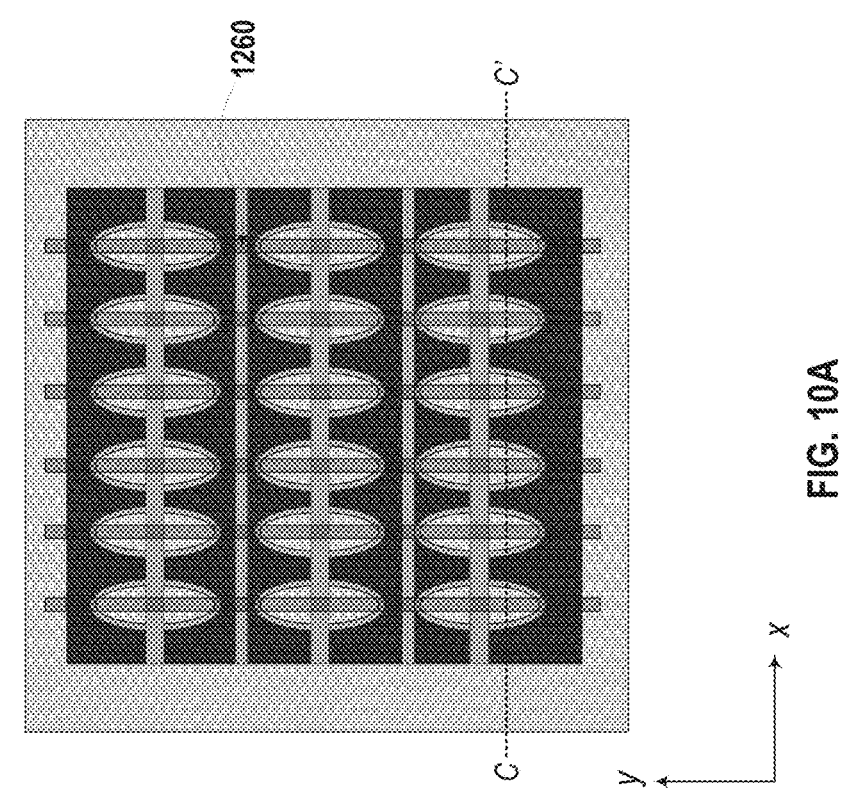
FIG. 10A illustrates a schematic plan view of an exemplary 3D memory device at a certain fabricating stage of the method shown in FIG. 4, according to various implementations of the present disclosure.

In some implementations, the semiconductor layer 510 can be thinned to expose second ends (i.e., undoped upper ends) of the semiconductor bodies 820 (used to be the lower ends before flipping over) opposite to the first end. In some implementations, planarization processes (e.g., CMP) and/or etching processes are performed to the semiconductor layer 510 until being stopped by the trench isolation structure 630. As illustrated in FIG. 10B, the exposed second ends of the semiconductor bodies 820 are doped to form another source/drain 1002. In some implementations, an implantation process and/or thermal diffusion process are performed to dope P-type dopants or N-type dopants to exposed upper ends of semiconductor bodies 820 to form sources/drains 1002. In some implementations, a silicide layer is formed on source/drain 1002 by performing a silicidation process at the exposed upper ends of semiconductor bodies 820. As a result, each vertical transistor having semiconductor body 820, sources/drains 827 and 1002, gate dielectric layer 724, and the three-sided gate structure (part of word line 850) can be formed thereby, as shown in FIG. 10B, according to some implementations.

In some implementations, a plurality of bit lines can be formed above the array of memory cells and electrically couple with a second end of each semiconductor body. As illustrated in FIG. 10B, bit lines 1026 can be formed to electrically couple with the sources/drain 1002 at the upper end of the semiconductor body 820 through a bit line contact 1014. In some implementations, the bit line contacts 1014 and the bit lines 1026 can be formed in multiple processes, including patterning and etching using lithography and etching processes, and depositing conductive materials using thin film deposition processes. For example, the bit line contacts 1014 and the bit lines 1026 can include conductive materials deposited by one or more thin film deposition processes including, but not limited to, CVD, PVD, ALD, electroplating, electroless plating, or any combination thereof. Fabrication processes to form the interconnects can also include photolithography, CMP, wet/dry etch, or any other suitable processes. As a result, bit lines 1026 and capacitors 990 can be formed on opposite sides of semiconductor body 820 and coupled to opposite ends of semiconductor body 820.

It is noted that the exemplary method 400 forms the capacitors 990 first at the first end of the semiconductor body 820 and then forms the bit lines 1026 at the second end of the semiconductor body 820. In some other implementations, the fabricating method can first form the bit lines 1026 at the first end of the semiconductor body 820, and then form the capacitors 990 first at the second end of the semiconductor body 820.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A semiconductor device, comprising:
an array of memory cells, each memory cell comprising:
    a capacitor; and
    a vertical transistor comprising:
        a semiconductor body extending in a vertical direction, comprising a curved sidewall and a flat sidewall, and in contact with the capacitor, and
        a three-sided gate structure surrounding the semiconductor body from three lateral directions.

2. The semiconductor device of claim 1, wherein:
the three-sided gate structure surrounds the curved sidewall of the semiconductor body.

3. The semiconductor device of claim 2, further comprising:
    a gate dielectric layer between the three-sided gate structure and the curved sidewall of the semiconductor body.

4. The semiconductor device of claim 1, wherein:
the three-sided gate structures of a row of the vertical transistors along a first lateral direction are connected with each other to form a word line extending along the first lateral direction, and the three lateral directions include at least two opposite lateral directions along the first lateral direction.

5. The semiconductor device of claim 4, further comprising:
    a plurality of first and second spacers each extending along the first lateral direction between rows of the vertical transistors.

6. The semiconductor device of claim 4, wherein:
    a plurality of first and second spacers are alternatively arranged along a second lateral direction perpendicular to the first lateral direction.

7. The semiconductor device of claim 6, wherein:
each first spacer is located between the curved sidewalls of the semiconductor bodies of two adjacent rows of vertical transistors.

8. The semiconductor device of claim 6, wherein:
each second spacer is located between the flat sidewalls of the semiconductor bodies of two adjacent rows of vertical transistors.

9. The semiconductor device of claim 6, wherein:
the semiconductor bodies are aligned along the second lateral direction.

10. The semiconductor device of claim 6, wherein:
the semiconductor bodies are aligned along a third lateral direction with a non-zero angle with respect to the first lateral direction.

11. The semiconductor device of claim 6, further comprising:
    a plurality of bit lines arranged in parallel along the second lateral direction,
wherein the capacitors are connected to first ends of the semiconductor bodies, and the bit lines are connected to second ends of the semiconductor bodies opposite to the first ends.

12. A memory system, comprising:
an array of memory cells, each memory cell comprising:
    a capacitor; and
    a vertical transistor comprising:
        a semiconductor body extending in a vertical direction and in contact with the capacitor, and
        a three-sided gate structure partially surrounding the semiconductor body from three lateral directions including at least two opposite lateral directions, without enclosing a fourth lateral direction,
        wherein the three-sided gate structure surrounds a curved sidewall of the semiconductor body; and
a memory controller configured to control the array of memory cells.

13. A semiconductor device, comprising:
an array of memory cells, each memory cell comprising:
    a capacitor; and
    a vertical transistor comprising:
        a semiconductor body extending in a vertical direction and in contact with the capacitor, and
        a three-sided gate structure partially surrounding the semiconductor body from three lateral directions, without enclosing a fourth lateral direction,
        wherein the three-sided gate structure surrounds a curved sidewall of the semiconductor body.

14. The semiconductor device of claim 13, wherein:
the three-sided gate structures of a row of the vertical transistors along a first lateral direction are connected with each other to form a word line extending along the first lateral direction, and the three lateral directions include at least two opposite lateral directions along the first lateral direction.

15. The semiconductor device of claim 14, further comprising:

a plurality of first and second spacers each extending along the first lateral direction between rows of the vertical transistors.

16. The semiconductor device of claim 15, wherein:

the plurality of first and second spacers are alternatively arranged along a second lateral direction perpendicular to the first lateral direction.

17. The semiconductor device of claim 16, wherein:

the semiconductor body of one vertical transistor comprises a curved sidewall and a flat sidewall.

18. The semiconductor device of claim 17, wherein:

each first spacer is located between the curved sidewalls of the semiconductor bodies of two adjacent rows of vertical transistors.

19. The semiconductor device of claim 17, wherein:

each second spacer is located between the flat sidewalls of the semiconductor bodies of two adjacent rows of vertical transistors.

* * * * *